(12) United States Patent
Yamada et al.

(10) Patent No.: US 8,196,067 B2
(45) Date of Patent: Jun. 5, 2012

(54) MASK FOR MULTI-COLUMN ELECTRON BEAM EXPOSURE, AND ELECTRON BEAM EXPOSURE APPARATUS AND EXPOSURE METHOD USING THE SAME

(75) Inventors: Akio Yamada, Tokyo (JP); Takayuki Yabe, Tokyo (JP); Hitoshi Tanaka, Tokyo (JP)

(73) Assignee: Advantest Corp., Tokyo (JP)

( * ) Notice: Subject to any disclaimer, the term of this patent is extended or adjusted under 35 U.S.C. 154(b) by 374 days.

(21) Appl. No.: 12/583,319

(22) Filed: Aug. 18, 2009

(65) Prior Publication Data
US 2009/0311613 A1    Dec. 17, 2009

Related U.S. Application Data

(63) Continuation of application No. PCT/JP2007/054040, filed on Mar. 2, 2007.

(51) Int. Cl.
*G06F 17/50* (2006.01)
(52) U.S. Cl. ............... 716/50; 716/51; 716/54; 716/55
(58) Field of Classification Search ............ 716/50, 716/51, 52, 54, 55; 355/72; 430/5, 30
See application file for complete search history.

(56) References Cited

U.S. PATENT DOCUMENTS
7,442,947 B2 * 10/2008 Yamada ............ 250/492.22

FOREIGN PATENT DOCUMENTS

| JP | 61-283121 | 12/1986 |
|---|---|---|
| JP | 62-270959 | 11/1987 |
| JP | 04-058518 | 2/1992 |
| JP | 2004-88071 | 3/2004 |
| JP | 2006-278492 | 10/2006 |
| WO | WO 01/06549 | 1/2001 |

OTHER PUBLICATIONS

Haraguchi et al. "Multicolumn cell: Evaluation of the proof of concept system", J. Vac. Sci. Technol. B 22(3), May/Jun. 2004, 2004 American Vcuum Society.

* cited by examiner

*Primary Examiner* — Sun Lin
(74) *Attorney, Agent, or Firm* — Muramatsu & Associates

(57) ABSTRACT

A mask for exposure, which is used in a multi-column electron beam exposure apparatus having multiple column cells, includes a stencil pattern group constituted by multiple stencil patterns for each of the multiple column cells. The stencil pattern groups are arranged at intervals corresponding to arrangement intervals of the multiple column cells, and all of the stencil pattern groups are formed on a single mask substrate. The stencil pattern groups include: a first stencil pattern group formed within a deflectable range of an electron beam of each of the multiple column cells; and a second stencil pattern group having two or more of the first stencil patterns.

13 Claims, 9 Drawing Sheets

MASK FOR MULTI-COLUMN ELECTRON BEAM EXPOSURE, AND ELECTRON BEAM EXPOSURE APPARATUS AND EXPOSURE METHOD USING THE SAME

CROSS-REFERENCE TO RELATED APPLICATIONS

This application is a continuation of prior International Patent Application No. PCT/JP2007/54040 filed Mar. 2, 2007, the entire contents of which are incorporated herein by reference.

BACKGROUND OF THE INVENTION

1. Field of the Invention

The present invention relates to an electron beam exposure apparatus and an electron beam exposure method, and, in particular, relates to a mask for multi-column electron beam exposure, the mask preferably being used for exposure using multiple column cells, and an electron beam exposure apparatus and an exposure method both using the mask.

2. Description of the Prior Art

In a conventional electron beam exposure apparatus, a stencil mask is provided with either a variable rectangular opening or multiple patterns, and the patterns are selected by beam deflection and transferred by exposure to a wafer. In such an electron beam exposure apparatus, although multiple mask patterns are provided, only a single electron beam is used for exposure. Accordingly, only one of the mask patterns is selected and transferred onto the wafer by the single electron beam at one time.

One of the exposure apparatuses having such a configuration is an electron beam exposure apparatus for partial one-shot exposure disclosed in, for example, Japanese Patent Application Laid-open Publication No. 2004-88071. The partial one-shot exposure is a technique used for transferring a pattern in the following steps in which: a region, for example 300 μm×300 μm, of a stencil pattern selected by beam deflection from multiple patterns, for example 100 pieces of patterns, arranged on a mask is irradiated with a beam; thereby the beam is formed to have a cross section shape of the selected stencil pattern; the beam having passed through the mask is deflected back by a deflector located in the subsequent stage; the beam is reduced at a certain reducing ratio, for example 1/10, determined by the configuration of an electron optical system; and then the pattern is transferred onto the surface of a sample wafer. The size of a region to be irradiated on the sample wafer is, for example, 5 μm×5 μm. In the partial one-shot exposure, if the stencil patterns are appropriately provided on the mask in accordance with a device pattern to be exposed, the number of necessary exposure shots can be largely reduced compared to the case where only a variable rectangular opening is provided on a mask. Accordingly, the throughput of exposure can be improved.

Meanwhile, a multi-column electron beam exposure apparatus is disclosed in Non-Patent document (see T. Haraguchi et. al., J. Vac. Sci. Technol, B22 (2004) 985). In the apparatus, an exposure process is performed by arranging, above a wafer, multiple column cells, each of which is equivalent to such a column of the exposure apparatus as described above but is in a smaller size, so that the multiple patterns can be transferred onto the wafer in parallel. Each of column cells is equivalent to a column in the single-column electron beam exposure apparatus; however, the throughput of the multi-column electron exposure can be increased by several times since the multiple patterns are transferred in parallel through the exposure process in the multi-column exposure system.

In the multi-column electron beam exposure apparatus, a stencil mask is mounted in each of the column cells for shaping the electron beam. Individual stencil masks are transferred by using a robot arm.

For example, in a multi-column electron beam exposure apparatus having 4 column cells in a 2×2 layout, it is easy to transfer stencil masks to be used in the respective column cells from outside of the column cells. However, when more column cells are provided, for example, in the case of a multi-column electron beam exposure apparatus having 16 column cells in a 4×4 layout, it is difficult to transfer stencil masks to be used in the 4 cells located in the middle.

In addition, in the case where different stencil masks are to be used in the column cells, it is necessary to provide a mask stage which can be independently driven in each of the column cells; thus, the structure becomes complicated. Furthermore, such a configuration will limit a movable range of the mask stages because they may interfere with each other when being driven.

SUMMARY OF THE INVENTION

The present invention has been made in view of the above-described problems associated with the prior art. Accordingly an object of the present invention is to provide: a mask for multi-column electron beam exposure that is easily mountable in a multi-column electron beam exposure apparatus; an electron beam exposure apparatus; and an exposure method using the mask.

The above-described objects can be achieved by a mask for use in a multi-column electron beam exposure apparatus provided with multiple column cells. The mask for multi-column electron beam exposure is characterized by including: a stencil pattern group constituted by multiple stencil patterns for each of the multiple column cells; and a single mask substrate mounted on a mask stage for moving the mask for exposure. Here, the stencil pattern groups are arranged at intervals corresponding to the intervals of the multiple column cells, and all the stencil pattern groups are mounted on the single mask substrate.

In the mask for multi-column electron beam exposure having such a configuration, the stencil pattern group may include: a first stencil pattern group which is formed in a deflection range of each of the electron beams of the multiple column cells; and a second stencil pattern group having multiple units of the first stencil pattern groups, the second stencil pattern being formed in a range where each of the electron beams of the multiple column cells can be deflected and the mask stage can be moved. The stencil pattern groups in the multiple column cells may be the same thereamong.

In the present invention, the mask on which the stencil patterns to be used by the multiple column cells are provided is formed on a unified mask substrate. In such a configuration, it is possible to transfer the stencil patterns at the same time even in the case where the multiple column cells are provided. Hence, being free from any adjustment process, the present invention can contribute to improving the throughput of exposure.

The above-described object can also be achieved by a multi-column electron beam exposure apparatus using the above-described masks for multi-column electron beam exposure. The multi-column electron beam exposure apparatus includes: a two-dimensionally movable mask stage provided to be shared among the column cells; and the mask substrate mounted on the mask stage. A movable distance of the two-dimensionally movable mask stage is equivalent to a width of the second pattern group formed on the mask substrate.

The multi-column electron beam exposure apparatus having such a configuration may further be provided with: a wafer stage on which a sample wafer including a reference mark for correction is mounted; a backscattered electron detector; and a mask mounting controller for mounting the mask substrate on the mask stage. In the multi-column electron beam exposure apparatus, it is configured that: a stencil pattern on the mask substrate is selected; a pattern, formed by the electron beam into a shape of the stencil pattern, is irradiated onto the sample wafer with the position of the reference mark as a target; a position in which a pattern has been actually drawn is determined according to an SEM image of the pattern obtained based on a backscattered electron detected by the backscattered electron detector; and the mounting position of the mask substrate is adjusted by the mask mounting controller when a displacement is detected between the position of the reference mark and the position in which the actually drawn pattern.

In the present invention, the unified mask substrate is mounted on the mask stage which is provided to be shared by all the multiple column cells.

With such a configuration, it is not necessary to bring masks separately into the individual column cells, resulting in all the respective masks brought into all the column cells at the same time. Accordingly, the overall process time can be reduced.

The configuration also does not require the installation of a mask transfer device or a mask moving mechanism in each of the column cells; thus, the structure of the exposure apparatus can be simplified.

The above-described object can also be achieved by a mask for exposure which is used in a multi-column electron beam exposure apparatus having multiple column cells. The mask for multi-column electron beam exposure includes: a stencil pattern group constituted by multiple stencil patterns for each of the multiple column cells; and a unified substrate on which the stencil pattern groups belonging to one or multiple column cells are formed. The unified substrates are arranged on a single pedestal substrate at intervals corresponding to the intervals of the multiple column cells. The single pedestal substrate is mounted on a mask stage for moving the mask for exposure.

In the mask for multi-column electron beam exposure having such a configuration, the stencil pattern group may include: a first stencil pattern group which is formed in a range of deflection of an electron beam; and a second stencil pattern group constituted by the first stencil pattern groups arranged two-dimensionally. The stencil pattern groups in the multiple column cells may also be the same thereamong.

The unified substrates may be configured to be detachable from the pedestal substrate.

In the present invention, the stencil pattern groups belonging to one or multiple column cells are formed on the unified substrate, and more than one unified substrates are arranged on a single pedestal substrate. In such a configuration, it is possible to transfer stencil masks at the same time even in the case where multiple column cells are provided. Hence, being free from any adjustment process for the mask position in each of the column cells, the present invention can contribute to improving the throughput of exposure.

In the present invention, the unified substrates can be detached from the pedestal substrate. With such a configuration, it is possible to exchange only a certain unified substrate having a problem, such as deformation of the stencil pattern. Hence, being able to reduce the time required for preparation and exchange of the mask, the present invention can contribute to improving the throughput of exposure.

DESCRIPTION OF THE PREFERRED EMBODIMENT

Hereinafter, embodiments of the present invention will be described by referring to drawings.

(1) First Embodiment

<A Structure of A Multi Column Electron Beam Exposure Apparatus>

Figure 1:
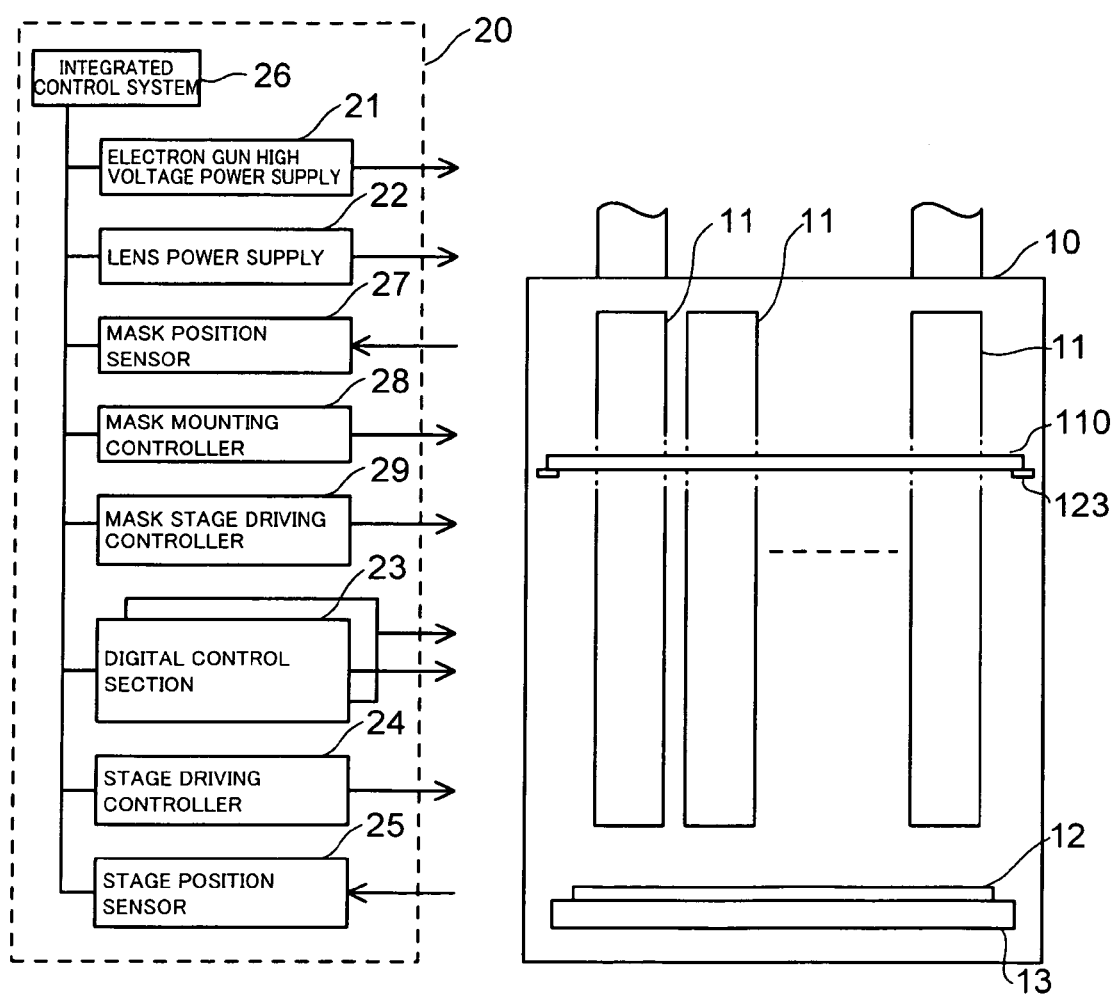
FIG. 1 is a block diagram of a multi-column electron beam exposure apparatus according to the present invention.

FIG. 1 is a schematic block diagram of a multi-column electron beam exposure apparatus according to the present embodiment.

The multi-column electron beam exposure apparatus is mainly divided into two parts: an electron beam column 10 and a control unit 20 for controlling the electron beam column 10. The framework of the electron beam column 10 is formed with multiple homogeneous column cells 11, for example, 16 of the column cells 11. All the column cells 11 included in one electron beam column 10 are composed of the same units, which will be described below. It should be noted that only a single stencil mask is used for all of the column cells. Under the column cells 11, arranged is a wafer stage 13 with a wafer 12 having a diameter of, for example, 300 mm mounted thereon.

The control unit 20 is composed of: an electron gun high voltage power supply 21; a lens power supply 22; a digital control section 23; a stage driving controller 24; a stage position sensor 25; a mask position sensor 27; a mask mounting controller 28; a mask stage driving controller 29; and an integrated control system 26 for controlling these sections. The electron gun high-voltage power supply 21 supplies power for driving an electron gun in each of the column cells 11 located in the electron beam column 10. The lens power supply 22 supplies power for driving an electromagnetic lens in each of the column cells 11 located in the electron beam column 10. The digital control section 23, which is an electric circuit for controlling a deflection output of each of deflectors located in the column cell 11, outputs a high-speed deflection output and the like. The number of the digital control sections 23 provided in the control unit 20 corresponds with the number of the column cells 11 provided in the electron beam column 10.

The mask position sensor 27 includes: a microscope which observes a reference positioning mark located on the mask stage and a positioning mark, corresponding to the reference positioning mark, located on the mask substrate in a single field of view; and an image analysis section for measuring the amount of relative dislocation between the mask stage and the mask substrate on the basis of the microscopic image. The mask mounting controller 28 includes: a mechanical part for performing fine adjustment of a mounting position and a mounting angle of the mask substrate on the mask stage; and a circuit part for controlling the mechanical part. The mask mounting controller 28 adjusts the position of the mask on the basis of information of the mask position from the mask position sensor 27. A reference mark for calibration, a backscattered electron detector, and a Faraday cup for measuring electric current are provided at an edge on the wafer stage 13.

The mask stage driving controller 29 moves a mask stage 123 according to an instruction from an integrated control system 26. The stage driving controller 24 moves the wafer stage 13 according to positional information from the stage position sensor 25 so that a desired surface portion of the wafer 12 can be irradiated with electron beam. The integrated control system 26, such as a workstation, systematically controls the sections 21 to 29 described above.

In the multi-column electron beam exposure apparatus described above, all of the column cells 11 have the same unit structure.

Figure 2:
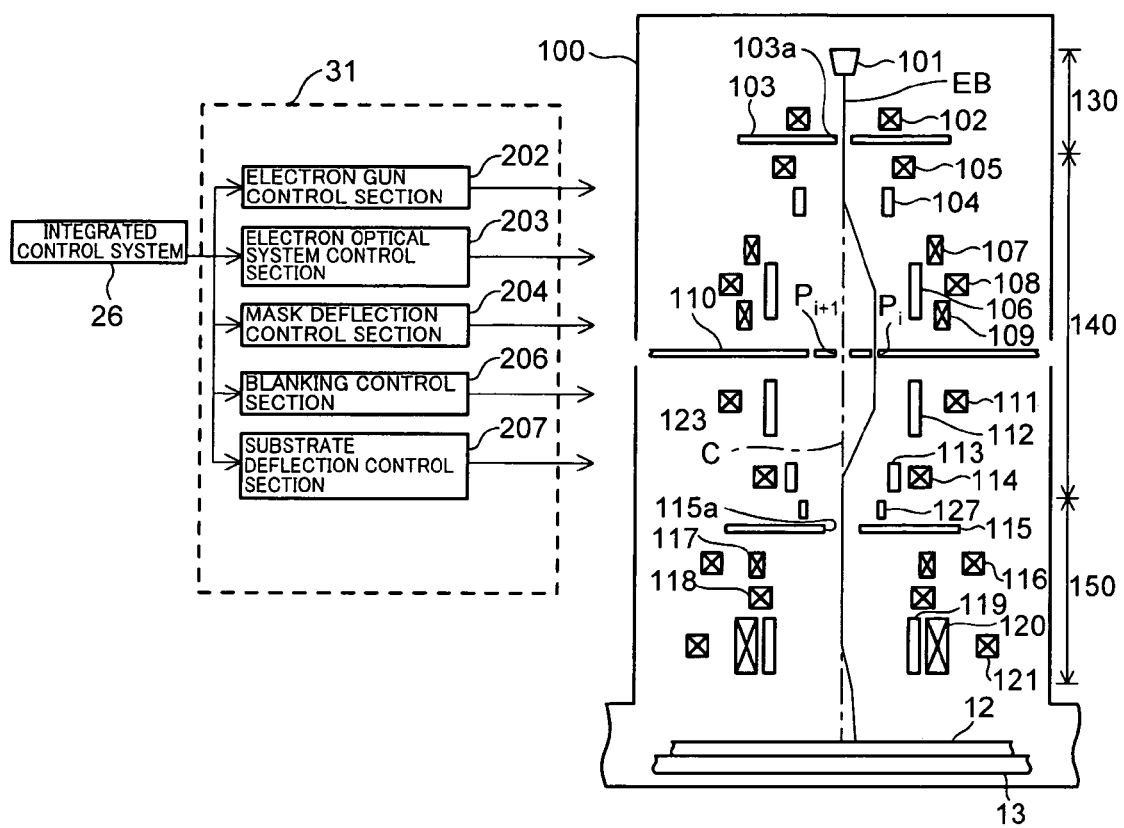
FIG. 2 is a block diagram of one column cell in the exposure apparatus illustrated in FIG. 1.

FIG. 2 is a schematic block diagram of one of the column cells 11 used in the multi-column electron beam exposure apparatus.

Each of the column cells 11 is mainly divided into two parts: an exposure unit 100 and a column cell control unit 31 for controlling the exposure unit 100. The exposure unit includes an electron beam generating part 130, a mask deflecting part 140, and a substrate deflecting part 150.

In the electron beam generating part 130, an electron beam EB generated from an electron gun 101 is converged by a first electromagnetic lens 102, and then goes through a rectangular aperture 103a on a beam shaping mask 103, resulting in the cross section of the electron beam EB shaped into a rectangular form.

Thereafter, the electron beam EB forms an image by a second electromagnetic lens 105 located in the mask deflecting part 140. Then, the electron beam EB is deflected towards a specific pattern P formed on an exposure mask 110 by first and second electrostatic deflectors 104 and 106, and the cross section of the electron beam EB is shaped into the shape of the pattern P.

It should be noted that the exposure mask 110 is fixed onto the mask stage 123 located in the electron beam column 10, and the mask stage 123 is movable within a horizontal plane. When a pattern P located outside of the deflection range of the first and second electrostatic deflectors 104 and 106 (beam deflection region), the mask stage 123 is moved so that the pattern P can come into the beam deflection region.

Third and fourth electromagnetic lenses 108 and 111, which are arranged above and below the exposure mask 110, respectively, adjust the amount of electric current thereof so that the electron beam EB can form an image on the substrate.

The electron beam EB passed through the exposure mask 110 is deflected back to an optical axis C by the deflective action of third and fourth electrostatic deflectors 112 and 113. Thereafter, the size of the electron beam EB is reduced by a fifth electromagnetic lens 114.

First and second correction coils 107 and 109 which are provided in the mask deflecting part 140 correct beam deflection aberrations generated in the first to fourth electrostatic deflectors 104, 106, 112, and 113.

Thereafter, the electron beam EB which has passed through an aperture 115a formed on a shielding plate 115 which is a constituent of the substrate deflecting part 150 is projected onto the substrate by first and second electromagnetic projection lenses 116 and 121. After these steps, an image of the pattern of the exposure mask 110 can be transferred onto the substrate at a predetermined reduction ratio, for example, 1/10.

A fifth electrostatic deflector 119 and an electromagnetic deflector 120, which are both provided in the substrate deflecting part 150, deflect the electron beam EB such that a image of the pattern of the exposure mask 110 can be projected at a predetermined position on the substrate.

The substrate deflecting part 150 is further provided with third and fourth correction coils 117 and 118 for correcting deflection aberration of the electron beam EB on the substrate.

The column cell control unit 31 is provided with: an electron gun control section 202; an electron optical system control section 203; a mask deflection control section 204; a blanking control section 206; and a substrate deflection control section 207. The electron gun control section 202 controls the electron gun 101 in order to control an accelerating voltage of the electron beam EB, beam emission conditions, and the like. The electron optical system control section 203 controls, for example, the amount of electric currents flowing into electromagnetic lenses 102, 105, 108, 111, 114, 116, and 121, in order to adjust an electron optical system composed of these electromagnetic lenses in terms of magnification, focus point, and the like. The blanking control section 206 controls a voltage applied to a blanking electrode 127 so as to deflect the electron beam EB having been generated prior to the initiation of exposure onto the shielding plate 115, and thereby prevents the substrate from being irradiated with the electron beam EB prior to the exposure.

The substrate deflection control section 207 controls a voltage applied to the fifth static deflector 119 and an amount of electric current flowing into the electromagnetic deflector 120 such that the electron beam EB can be deflected onto a predetermined position on the substrate. The integrated control system 26, such as a workstation, systematically controls the sections 202 to 207 described above.

Figure 3:
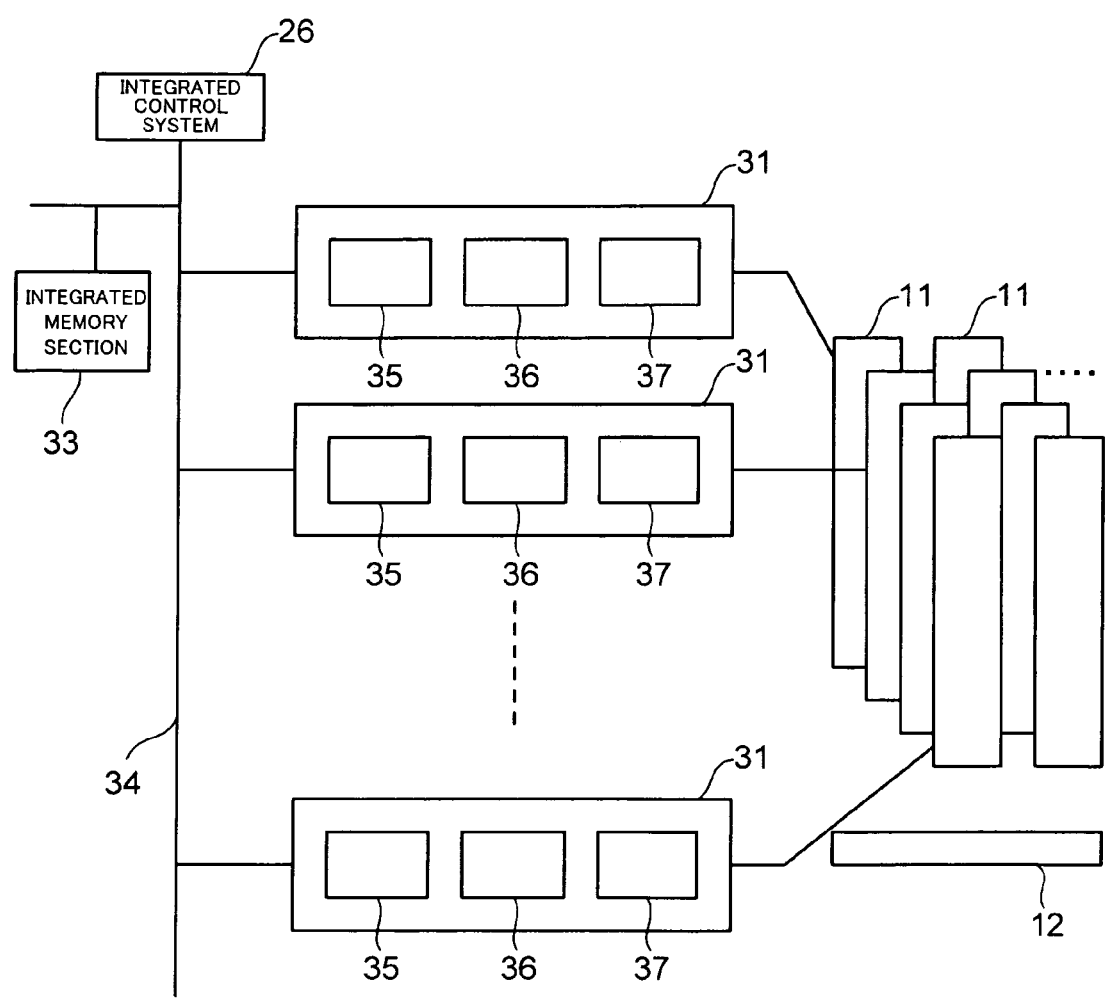
FIG. 3 is a schematic view of a column cell control unit in the exposure apparatus illustrated in FIG. 2.

FIG. 3 is a schematic view of the column cell control unit 31 in the multi-column electron beam exposure apparatus. Each of the column cells 11 includes the column cell control unit 31. The column cell control units 31 are each connected via a bus 34 to the integrated control system 26 which controls the whole multi-column electron beam exposure apparatus. Data, such as exposure data, required by all the column cells are stored in an integrated memory section 33. The integrated memory section 33 is also connected to the integrated control system 26 via the bus 34.

In a multi-column electron beam exposure apparatus having such a configuration, exposure data of a pattern to be exposed onto the wafer 12 mounted on the wafer stage 13 are transferred from the integrated memory section 33 to a column cell memory section 35 located in each of the column cell control units 31. The transferred exposure data are corrected in a correction section 36 located in each of the column cell control units 31, and then the pattern corresponding to the exposure data is exposed on the exposure regions of the wafer 12, which are each allocated to the individual column cells 11.

<Structure of Stencil Mask>

Subsequently, a structure of a stencil mask formed on a unified substrate will be described in detail by referring to FIGS. 4A to 4C.

Figure 4A:
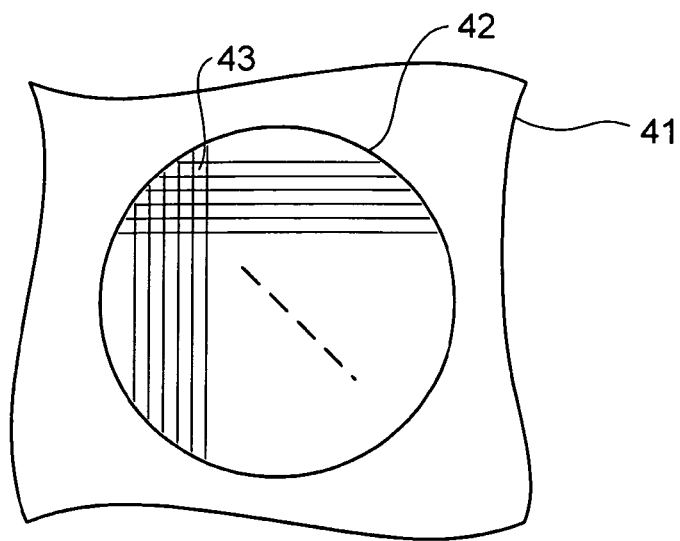
FIGS. 4A to 4C are diagrams for explaining a structure of a stencil mask used in a first embodiment.

FIG. 4A illustrates a first stencil pattern group 42 formed in a range in which an electron beam can be deflected by the deflectors located in each of the column cells. The stencil pattern group 42 formed on a silicon substrate 41 is a set of multiple small compartments 43 having a size of 50 µm×50 µm, and each of the small compartments 43 includes a frequently-used stencil pattern or the like formed therein. The electron beam selects one of the small compartments 43, and thereby the cross section of the electron beam is shaped; thus, a desired pattern is exposed on the wafer.

Figure 4B:
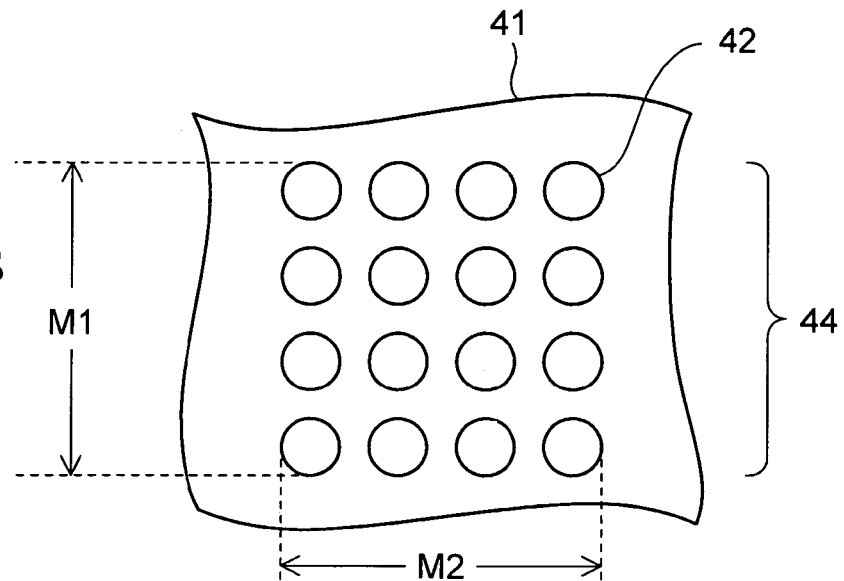

FIG. 4B illustrates a second stencil pattern 44 which consists of multiple first stencil pattern groups 42. Since various stencil patterns are required for exposure, it is sometimes insufficient to have only the first stencil pattern 42. Therefore, multiple first stencil patterns 42 are prepared to form the second stencil pattern 44.

Patterns formed in the second stencil pattern 44 are used in one of the column cells.

In the present embodiment, multiple second stencil pattern groups 44 are formed on one mask substrate. In other words, all the stencil patterns to be used by all the column cells are formed on a single mask substrate.

Figure 4C:
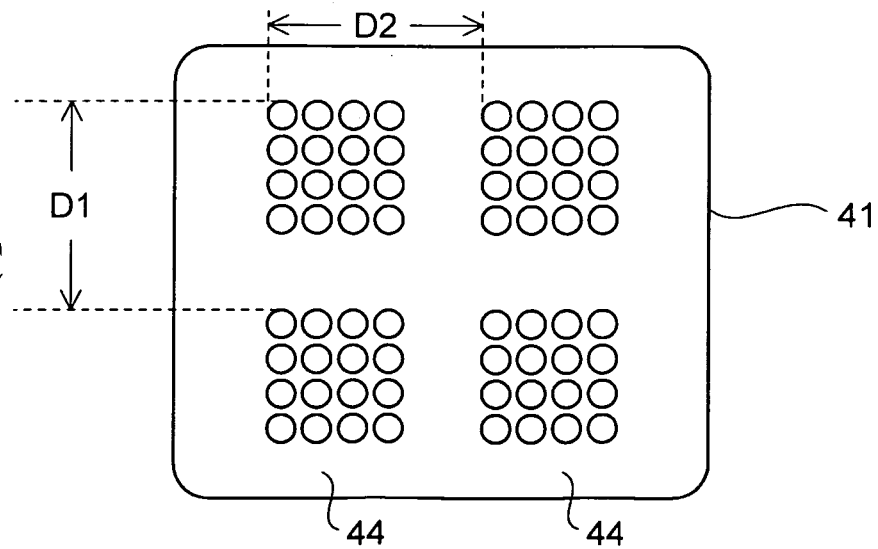

FIG. 4C illustrates an example of an arrangement of stencil patterns on the mask substrate in the case where the electron beam column 10 consists of 4 column cells in a 2×2 layout.

The mask substrate thus formed is mounted on the mask stage which is shared by all the column cells.

Figure 5:
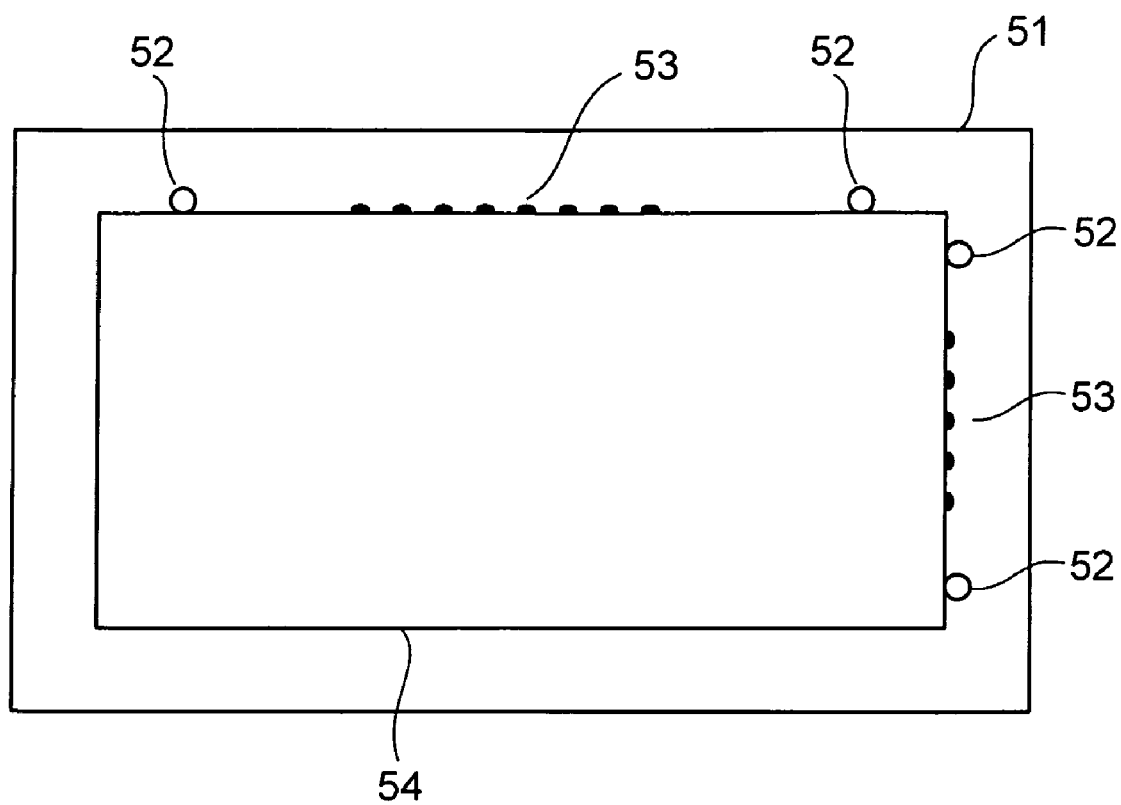
FIG. 5 is a diagram illustrating an example of the state of the mask substrate illustrated in FIG. 4C mounted on a mask stage.

FIG. 5 illustrates the state of a mask stage 51 having the mask substrate 54 mounted thereon. The mask substrate 54 is loaded on the mask stage 51 so as to come into contact with pins 52 which indicate the setting position of the substrate. Furthermore, in order to load the mask substrate 54 with accuracy, reference lines 53 are provided on the mask stage 51 so that it can be detected whether or not there is a displacement between the reference lines 53 and the sides of the mask substrate 54 by use of the mask position sensor 27. According to the amount of displacement thus detected, the position of the mask substrate 54 is adjusted by the mask mounting controller 28 so that any displacement of the mask substrate 54 in the position in directions of X, Y, and rotation can be eliminated.

The mechanical part for performing fine adjustment of the position of the mask substrate 54 may be arranged inside or outside of the mask stage 51. By having such a configuration, it is possible to include only one mechanical part for performing fine adjustment for multiple column cells 11. As for the fine adjustment, for example, an elastic structure may be provided in which the mask substrate 54 is moveable in a direction of pushing the pins 52. To be more specific, it may be configured that two to four out of the four pins 52 illustrated in FIG. 5 are configured to be moveable, and an elastic body, such as a spring, is provided so as to push the pins 52 towards the mask substrate 54. With such a configuration, it is possible to adjust the amount of distance by external pressure applied to X and Y directions for adjusting the position of the mask substrate 54. Namely, the pins 52 can move back and forth elastically, and thereby adjust the mask substrate 54 in a rotational direction.

In the configuration where the mask substrate is mounted on the mask stage as described above, a desired pattern can be selected by deflecting the electron beam and moving the mask stage.

The deflection range of the electron beam is approximately 1.6 mm to 2.0 mm, and this range is equivalent to the range of the first stencil pattern group 42. Accordingly, in the case where a selected first stencil pattern group 42 does not include a desired stencil pattern, the mask stage is moved so that a stencil pattern in a different first stencil pattern group 42 can be selected.

The range of the second stencil pattern group 44 corresponds to a range of one of the column cells. Therefore, the mask stage is configured to be movable within the distances, (M1, M2) shown in FIG. 4B, which are the widths of the second stencil pattern group 44. By having such a configuration, it is possible that the electron beam in each of the column cells can select any of the stencil patterns formed in the second stencil pattern group 44.

The throughput of exposure is improved in the multi-column electron beam exposure apparatus by employing the method for exposing the same pattern among the column cells. Furthermore, in the multi-column electron beam exposure apparatus, it is possible to select any one of the multiple small compartments 43 located in the first stencil pattern group 42 by controlling the deflection of the electron beam. Therefore, it is also possible to expose the wafer with different patterns within one column cell if needed. In this configuration, the throughput of exposure can be improved by using multiple electron beams. For this reason, different second stencil patterns 44 may have the same stencil patterns having various shapes formed in the same arrangement.

It is required that the second stencil pattern groups 44 be arranged in the same arrangement as that of the column cells. However, it is difficult to perfectly match such arrangements due to mechanical production errors and the like. Therefore, in the present embodiment, regarding a positional accuracy, it is configured that the arrangement distances among the second stencil pattern groups 44, (D1, D2) shown in FIG. 4C, have a margin of 100 µm or less relative to a target distance (for example, 50 mm), which is a predetermined value according to arrangement distances among the column cells.

The small compartments 43 are formed in a size of 50 µm×50 µm in the first stencil pattern group 42. Thus, with a positional accuracy of approximately 100 µm, which is equal to the side of two of the small compartments 43 combined, an electron beam being irradiated onto one small compartment 43 does not leak to an adjacent small compartment 43.

As described above, all the stencil masks used in the multiple column cells are formed in a single mask substrate in the mask for multi-column electron beam exposure of the present embodiment. With such a configuration, it is not necessary to bring the masks separately into the individual column cells, since all the masks can be brought into all the column cells at the same time. Accordingly, the overall process time can be reduced.

The configuration also does not require the installation of a mask transfer device or a mask moving mechanism in each of the column cells; thus, the structure of the exposure apparatus can be simplified.

Furthermore, the reference lines are provided for mounting each of the mask substrates on the mask stage. By employing these reference lines, it is possible to mount each of the mask substrates on the mask stage with high accuracy.

<Description of a Multi-Column Electron Beam Exposure Method>

Subsequently, a description will be given of an exposure method in the multi-column electron beam exposure apparatus described above.

Figure 6:
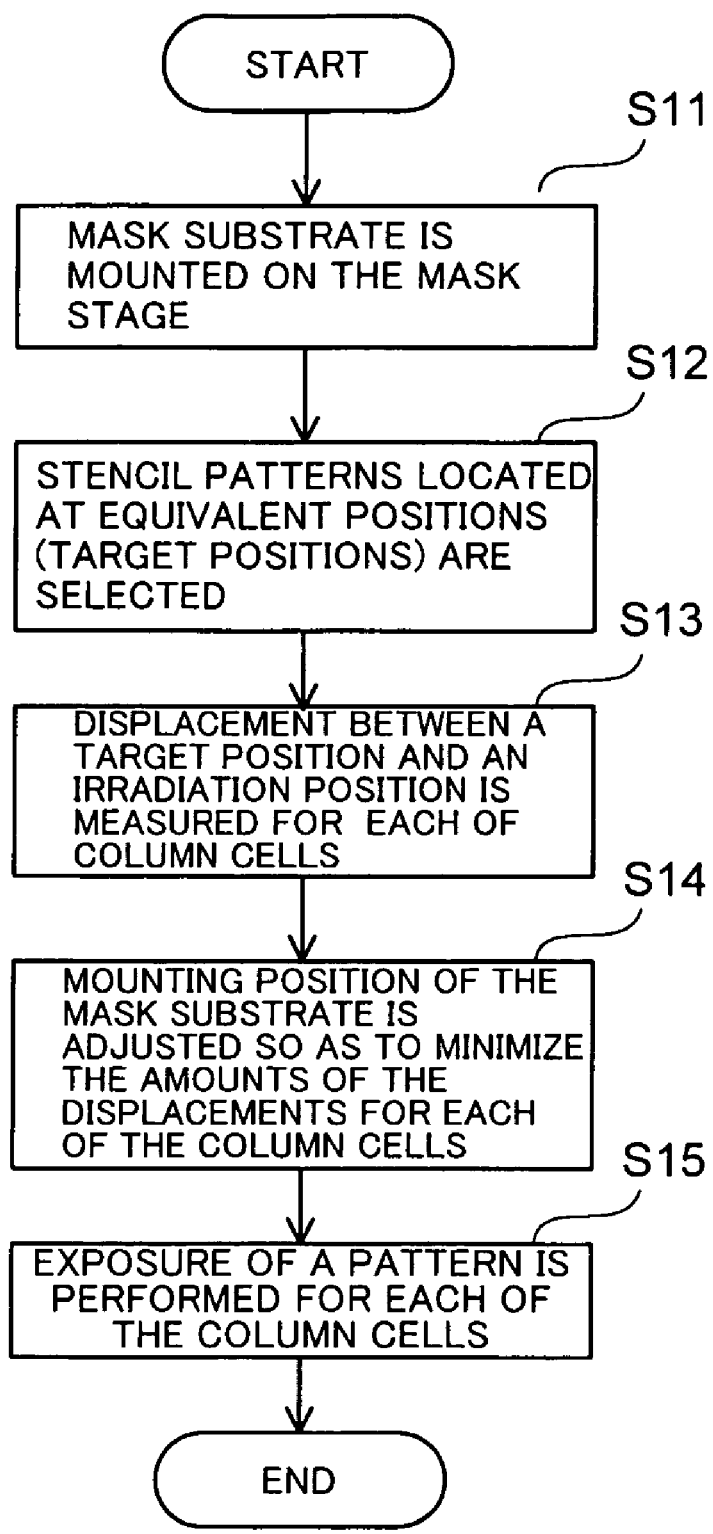
FIG. 6 is a flowchart illustrating an example of an exposure method using the mask substrate illustrated in FIG. 4C.

FIG. 6 is a flowchart describing an exposure method in the multi-column electron beam exposure apparatus according to the present invention.

Firstly, in a step S11, one mask substrate is mounted on the mask stage which is shared by multiple column cells. In this mounting step, the position of the mask substrate is adjusted and fixed such that the sides of the mask substrate correspond with the reference lines formed on the mask stage.

Figure 7:
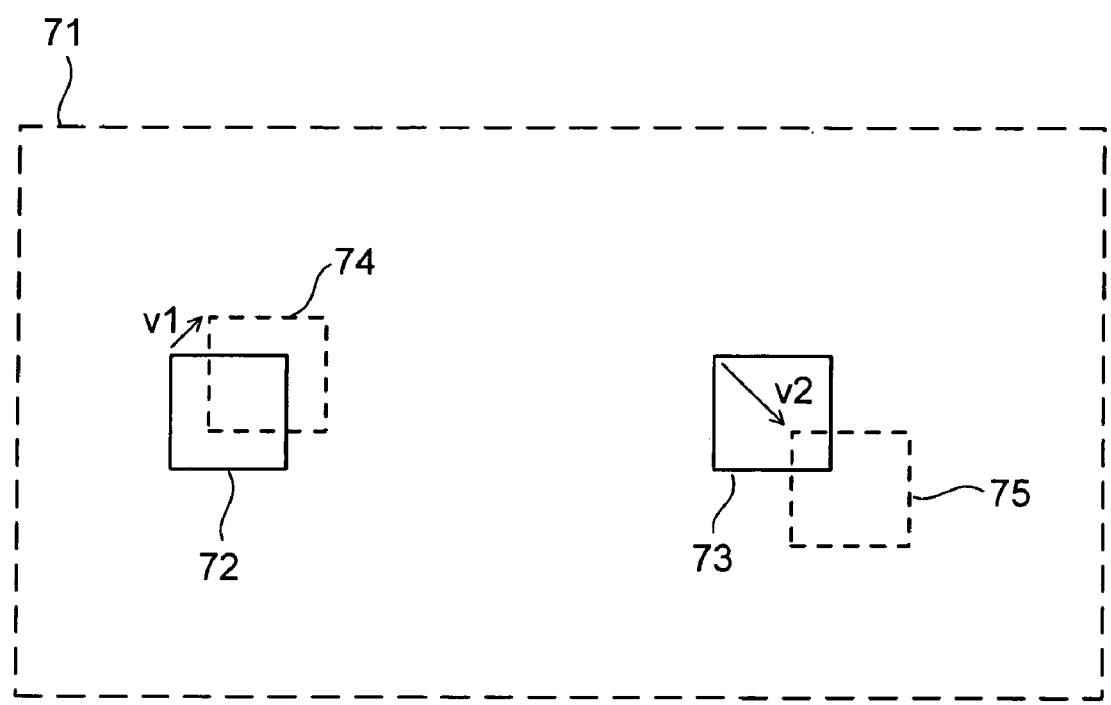
FIG. 7 is a diagram for explaining an adjustment process performed on the mask substrate.

Next, in a step S12, stencil patterns located at equivalent positions among the stencil pattern groups are selected for each column cells. For example, as shown in FIG. 7, stencil patterns (72, 73) located at equivalent positions (target positions) on the mask stage are respectively selected for two column cells.

Then, in a step S13, a displacement between a target position and an irradiation position is measured as a position coordinate on the mask stage for each of the column cells for the stencil patterns 72 and 73 selected in the step S12. For example, in FIG. 7, the electron beam is deflected such that the first stencil pattern 72 which is a target position within the stencil pattern group corresponding to a first column cell is selected. The wafer stage is moved and/or the electron beam is deflected so that the electron beam having been shaped into a rectangular form by the first stencil pattern 72 can be irradiated at the center of the reference mark provided on the wafer stage. Thereafter, an irradiation region 74 of the electron beam is specified according to the result from the acquisition of an SEM image obtained by a sweep operation using the backscattered electron detector. In this process, it is possible to obtain the irradiation region 74 having a disposition of V1, in shown in FIG. 7, relative to the stencil pattern 72 which is a target position. Likewise, the electron beam is deflected such that the second stencil pattern 73 which is a target position within the stencil-pattern group corresponding to a second column is selected. The wafer stage is moved and/or the electron beam is deflected so that the electron beam having been shaped into a rectangular form by the second stencil pattern 73 can be irradiated at the center of the reference mark provided on the wafer stage. Thereafter, an irradiation region 75 of the electron beam is specified according to the result from the acquisition of an SEM image obtained by a sweep operation using the backscattered electron detector. In this process, it is possible to obtain the irradiation region 75 having a disposition of V2, in shown in FIG. 7, relative to the stencil pattern 73 which is a target position. The distance between the irradiation region 74 and the irradiation region 75 may be calculated based on the amount of deflection of the electron beam and the amount of move of the wafer stage. The displacement between a target position and an irradiation region may be measured at more than one site. In addition, by utilizing a Faraday cup for measuring electric current prior to the acquisition of the SEM image, it is possible to specify the irradiation regions 74 and 75 of the electron beam. Hence, the measuring time may be shortened by making the area of the SEM image to be obtained smaller.

Next, in a step S14, the mounting position of the mask substrate on the mask stage is adjusted according to the amounts of the displacements, V1 and V2, measured in the step S13. For example, in the case of FIG. 7, by rotating a mask substrate 71 so as to minimize the amounts of the displacements, it is possible for each of the column cells to select the same stencil mask having less displacement therebetween. In addition, the displacement between the column cells may be registered as a correction value for distance between column cells, and deflection of an electron beam may be corrected according to the correction value prior to exposure.

Next, in a step S15, exposure of a pattern is performed for each of the column cells on the basis of exposure data by using the unified mask substrate adjusted as described above.

As described above, in the exposure method of the present embodiment, the unified mask substrate, on which all the stencil patterns used by the column cells are formed, is mounted on the mask stage such that the sides of the unified mask substrate match the corresponding reference lines on the mask stage. Furthermore, an electron beam is actually irradiated, the stencil patterns having the same shape and being located at an equivalent position (a target position) among the column cells are selected, and then a displacement between the target position and the irradiation position is measured. Thereafter, the mounting angle of the mask substrate is adjusted so as to minimize the displacement for each of the column cells. By adopting this method, it is possible to bring in the mask substrate for all the column cells at once, to reduce the time required for the adjustment of the position of the mask substrate relative to the column cells compared to the case where a mask substrate is independently arranged in each column cell, and thereby to improve the throughput of exposure.

(2) Second Embodiment

In the first embodiment, it is configured that stencil patterns used by multiple column cells are formed on the unified mask substrate. In a second embodiment, it is the same as the first embodiment that stencil patterns used by multiple column cells are unified. The difference of the second embodiment from the first embodiment is that stencil patterns formed for each column or multiple columns are mounted on different pedestals. It should be noted that the configuration of a multi-column electron beam exposure apparatus used in the present embodiment is the same as that in the first embodiment; therefore, the description will be omitted.

Figure 8A:
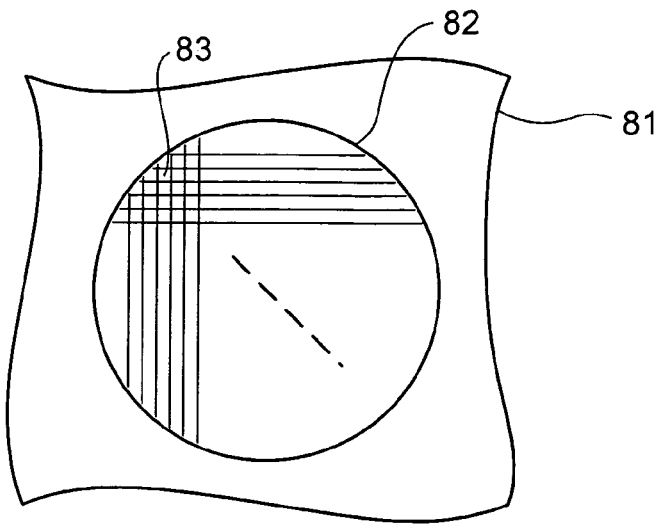
FIGS. 8A to 8C are diagrams for explaining a structure of a stencil mask used in a second embodiment.
Figure 8B:
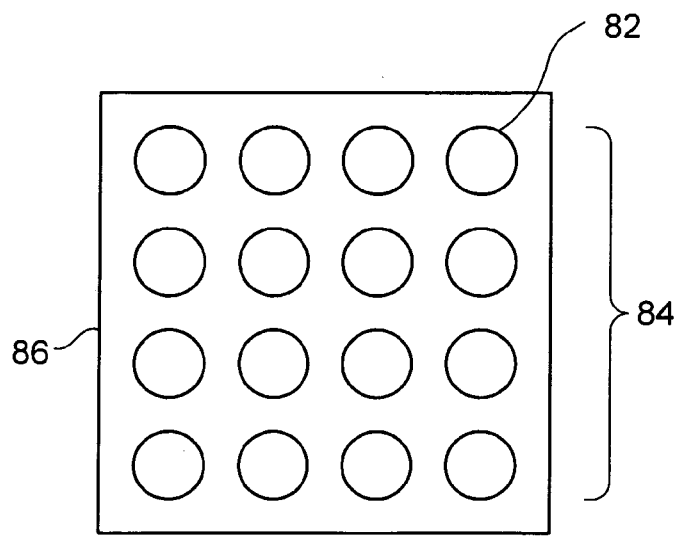
Figure 8C:
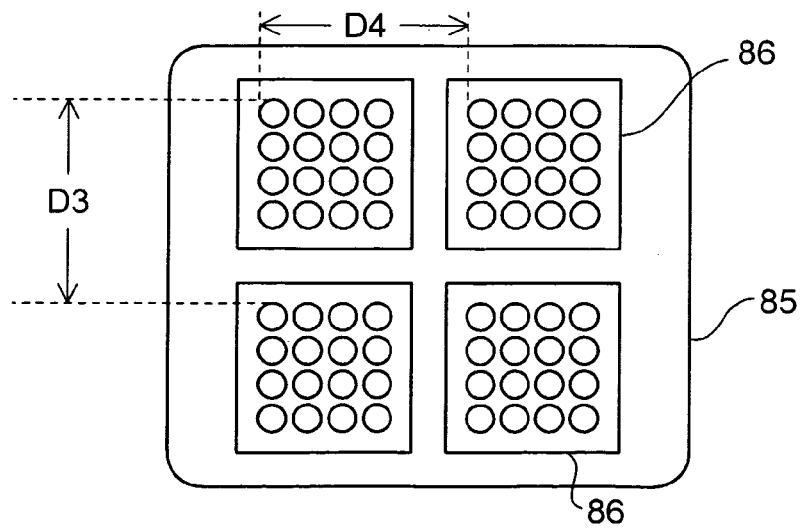

FIGS. 8A to 8C are diagrams illustrating a configuration of stencil masks formed on one pedestal substrate. FIG. 8A illustrates a first stencil pattern group 82 formed in a range in which an electron beam can be deflected by the deflectors located in one column cell. The stencil pattern group 82 formed on a silicon substrate 81 is a set of multiple small compartments 83 having a size of 50 μm×50 μm, and the small compartments 83 each include a frequently-used stencil pattern or the like formed therein. The electron beam selects one of the small compartments 83, and thereby the cross section of the electron beam is shaped; thus, a desired pattern is exposed on the wafer.

FIG. 8B illustrates a second stencil pattern 84 which consists of multiple first stencil pattern groups 82. Since various stencil patterns are required for exposure, it is sometimes insufficient to have only the first stencil pattern 82. Therefore, multiple first stencil patterns 82 are prepared to form the second stencil pattern 84.

Patterns formed in the second stencil pattern 84 are used in one of the column cells.

In the present embodiment, the second stencil pattern groups 84, each of which is a stencil pattern used by one column cell, are formed on a unified substrate 86. Multiple unified substrates 86 are mounted on a pedestal substrate to from a unified pedestal substrate 85.

FIG. 8C illustrates an example of an arrangement of stencil patterns on the pedestal substrate 85 in the case where the electron beam column 10 consists of 4 column cells in a 2×2 layout.

The pedestal substrate 85 thus formed is mounted on the mask stage which is shared by all the column cells.

The process for mounting one pedestal substrate 85 on the mask stage is the same as that in the first embodiment.

The patterns formed on the unified substrate 86 mounted on the mask stage can be selected by deflecting the electron beam and moving the mask stage.

The deflection range of an electron beam is approximately 1.6 mm to 2.0 mm, and this range is equivalent to the range of the first stencil pattern group 82. Accordingly, in the case where a selected first stencil pattern group 82 does not include a desired stencil pattern, the mask stage is moved so that a stencil pattern in a different first stencil pattern group 82 can be selected.

The range of the second stencil pattern group 84 corresponds to a range of one of the column cells. Therefore, the mask stage is configured to be movable within the distances which are the widths of the second stencil pattern group 84. In such a configuration, it is possible that an electron beam in each of the column cells can select any of all the stencil patterns formed in the second stencil pattern group 84.

It may be configured that the arrangement distances among the second stencil pattern groups 84, (D3, D4), have a margin less than 100 μm relative to a target distance (for example, 50 mm), which is a predetermined value according to arrangement distances among the column cells.

The small compartments 83 are formed in a size of 50 μm×50 μm in the first stencil pattern group 82. Thus, with a positional accuracy of approximately 100 μm, which is equal to the side of two of the small compartments 83 combined, an electron beam being irradiated onto one small compartment 84 does not leak to an adjacent small compartment 83.

Furthermore, the pedestal substrate 85 is provided in advance with reference lines which indicate positions for the unified substrates 86 to be arranged. The unified substrates 86 are arranged so as to have the sides along the corresponding reference lines. However, it is difficult to match the sides and the corresponding lines thereof perfectly. Therefore, in the present embodiment, it is configured that the unified substrates 86 are arranged relative to the reference lines at an angle accuracy within 1 mrad.

As described above, in the multi-column electron beam exposure mask of the present embodiment, the unified substrate 86 having the stencil patterns used in one column cell provided thereon is formed, and multiple unified substrates 86 are mounted on one pedestal substrate 85. With such a configuration, it is not necessary to bring the masks separately into the individual columns, since all the masks can be bought into the column cells at the same time. Accordingly, the overall process time can be reduced.

The configuration also does not require the installation of a mask transfer device or a mask moving mechanism in each of the column cells; thus, the structure of the exposure apparatus can be simplified.

The pedestal substrate 85 is made of, for example, conductive ceramics, and the unified substrate 86 made of silicon is attached by a conductive adhesive agent.

The unified substrate may also be mounted on the pedestal substrate 85 in a manner detachable therefrom. In such a configuration, if a problem, such as deformation of stencil pattern, occurs to one of the unified substrates 86, it is possible to exchange only the unified substrate having such a problem. Hence, being able to reduce the time required for preparation and exchange of the mask, the present embodiment can contribute to improving the throughput of exposure process.

It may also be configured that not only one but multiple second stencil pattern groups are formed on the unified substrate 86.

Figure 9A:
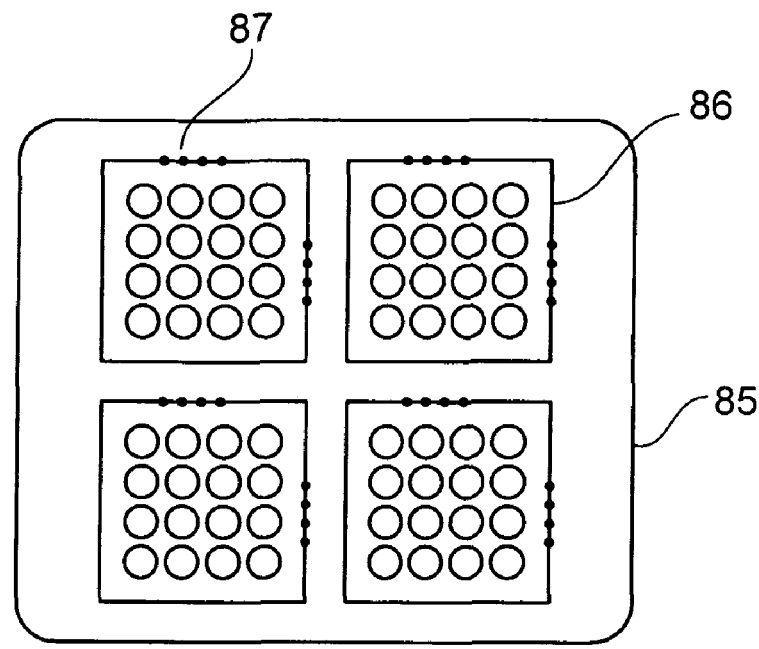
FIGS. 9A and 9B are diagrams each illustrating an example of a structure of a pedestal substrate.

FIG. 9A illustrates an example of four second stencil pattern groups 84, which are respectively used in four column cells, each formed on the unified substrate 86. These four unified substrates 86 are mounted on one pedestal substrate 85.

Figure 9B:
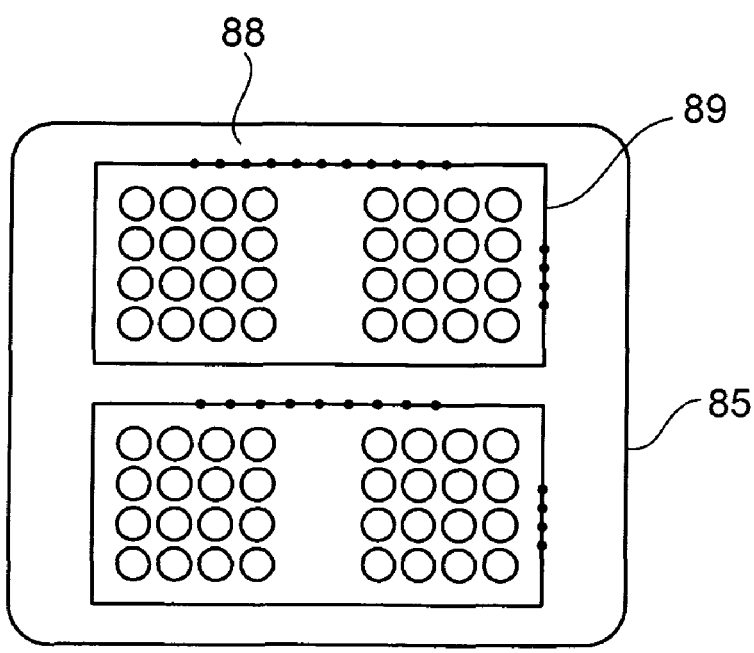

FIG. 9B is a diagram illustrating an example of two second stencil pattern groups 84, which are respectively used in two column cells, formed on one unified substrate 89.

Being formed as described in FIG. 9B, the unified substrates have longer sides than those of the unified substrates having one second stencil pattern group formed thereon. Accordingly, reference lines 88 indicating positions for the unified substrates 89 to be attached are longer than reference lines 87; thus, it is possible to install unified substrates 89 with high accuracy.

What is claimed is:

1. A mask for for use in a multi-column electron beam exposure apparatus having a plurality of column cells, comprising:
    stencil pattern groups each being constituted by a plurality of stencil patterns, the stencil pattern groups respectively being provided for the plurality of column cells; and
    a single mask substrate mounted on a mask stage for moving the mask for exposure,
    wherein the stencil pattern groups are arranged at intervals corresponding to arrangement intervals of the plurality of column cells, and
    wherein all of the stencil pattern groups are mounted on the single mask substrate.

2. The mask for use in a multi-column electron beam exposure apparatus according to claim 1, wherein the stencil pattern groups include:
    first stencil pattern groups each being formed within a deflectable range of an electron beam of each of the plurality of column cells; and
    a second stencil pattern group having two or more of the first stencil pattern groups, the second stencil pattern group being formed within a deflectable range of the electron beam of each of the plurality of column cells and within a movable range of the mask stage.

3. The mask for use in a multi-column electron beam exposure apparatus according to claim 2, wherein the stencil pattern groups are the same among the plurality of column cells.

4. A multi-column electron beam exposure apparatus using a mask for multi-column electron beam exposure according to claim 2, comprising:
    a two-dimensionally movable mask stage provided to be shared by all the column cells, wherein
    the single mask substrate is mounted on the two-dimensionally movable mask stage, and
    a movable distance of the two-dimensionally movable mask stage is equal to a width of the second stencil pattern group formed on the single mask substrate.

5. The multi-column electron beam exposure apparatus according to claim 4, further comprising:
    a wafer stage for mounting a sample wafer including a reference mark for correction;
    a backscattered electron detector; and
    a mask mounting controller for mounting a single mask substrate onto the two-dimensionally movable mask stage, wherein
        a stencil pattern formed on the single mask substrate is selected,
        a pattern formed by an electron beam into a shape of the stencil pattern, is irradiated onto the sample wafer with a position of the reference mark as a target, a position in which the pattern has been actually drawn is determined from an SEM image of the pattern, the SEM image being obtained based on a backscattered electron detected by the backscattered electron detector, and a mounting position of the single mask substrate is adjusted by the mask mounting controller when a displacement is detected between the position of the reference mark and the position of the actually drawn pattern.

6. A multi-column electron beam exposure method using the multi-column electron beam exposure apparatus according to claim 5, comprising the following steps of:

selecting stencil patterns located at equivalent positions in the column cells respectively by use of respective electron beams on optical axes in the column cells;

measuring a displacement between a position of the stencil pattern and a position irradiated with the electron beam in each of the column cells;

adjusting an mounting angle of the single mask substrate so as to minimize the displacement measured for said each of the column cells; and exposing a sample wafer by using the single mask substrate of which the mounting angle has been adjusted.

7. A mask for for use in a multi-column electron beam exposure apparatus having a plurality of column cells, comprising:

stencil pattern groups each being constituted by a plurality of stencil patterns, the stencil pattern groups being respectively provided for the plurality of column cells; and unified substrates in each of which the stencil pattern groups belonging to at least one of the plurality of column cells is formed, wherein the unified substrates are mounted on a single pedestal substrate at intervals corresponding to arrangement intervals of the plurality of column cells, and wherein the single pedestal substrate is mounted on a mask stage for moving the mask for exposure.

8. The mask for use in a multi-column electron beam exposure apparatus according to claim 7, wherein the stencil pattern groups are constituted by:

a first stencil pattern group formed in a deflectable range of an electron beam, and a second stencil pattern group having the first stencil pattern group two-dimensionally arranged.

9. The mask for use in a multi-column electron beam exposure apparatus according to claim 8, wherein the stencil pattern groups are the same among the plurality of column cells.

10. The mask for use in a multi-column electron beam exposure apparatus according to claim 8, wherein the unified substrates are detachable from the single pedestal substrate.

11. A multi-column electron beam exposure apparatus using the mask according to claim 10, comprising a two-dimensionally movable mask stage provided to be shared by the plurality of column cells, wherein the single pedestal substrate is mounted on the two-dimensionally movable mask stage, and a movable distance of the two-dimensionally movable mask stage is equal to a width of the second stencil pattern group mounted on the single pedestal substrate and formed on the unified substrates.

12. The multi-column electron beam exposure apparatus according to claim 11, further comprising:

a wafer stage for mounting a sample wafer including a reference mark for correction;

a backscattered electron detector; and a mask mounting controller for mounting the single pedestal substrate onto the two-dimensionally movable mask stage, wherein a stencil pattern formed on the single pedestal substrate is selected, a pattern, formed by an electron beam into a shape of the stencil pattern, is irradiated onto the sample wafer with a position of the reference mark as a target, a position in which the pattern has been actually drawn is determined from an SEM image of the pattern, the SEM image being obtained based on a backscattered electron detected by the backscattered electron detector, and a mounting position of the single pedestal substrate is adjusted by the mask mounting controller when a displacement is detected between the position of the reference mark and the position of the actually drawn pattern.

13. A multi-column electron beam exposure method using the multi-column electron beam exposure apparatus according to claim 12, comprising the following steps of:

selecting a stencil pattern at an equivalent position among the plurality of column cells by use of an electron beam on an optical axis in each of the plurality of column cells;

measuring a displacement between a position of the selected stencil pattern and a position irradiated with the electron beam in said each of the plurality of column cells;

adjusting an mounting angle of the single pedestal substrate so as to minimize the displacement measured for said each of the plurality of column cells; and exposing a sample wafer by using the single pedestal substrate of which the mounting angle has been adjusted.

* * * * *